United States Patent [19]

Yoshimura et al.

[11] Patent Number: 5,507,896
[45] Date of Patent: Apr. 16, 1996

[54] METHOD OF MANUFACTURING CERAMIC LAMINATED COMPACT

[75] Inventors: Toshimi Yoshimura; Shigehiro Nojiri; Shin-ichi Takakura; Katumi Katoh, all of Kyoto, Japan

[73] Assignee: Murata Manufacturing Co., Ltd., Japan

[21] Appl. No.: 744,648

[22] Filed: Aug. 8, 1991

Related U.S. Application Data

[63] Continuation of Ser. No. 451,227, Dec. 15, 1989, abandoned.

[30] Foreign Application Priority Data

Dec. 15, 1988 [JP] Japan .................................. 63-317031

[51] Int. Cl.$^6$ .................................................. B32B 31/00
[52] U.S. Cl. ............................ 156/89; 156/285; 156/382
[58] Field of Search ............................. 156/89, 382, 285

[56] References Cited

U.S. PATENT DOCUMENTS

| | | | |
|---|---|---|---|
| 4,362,588 | 12/1982 | Anton et al. | 156/382 X |
| 4,749,421 | 6/1988 | Matsui et al. | 156/89 |

FOREIGN PATENT DOCUMENTS

| | | |
|---|---|---|
| 805968 | 12/1958 | United Kingdom . |
| 834413 | 5/1960 | United Kingdom . |
| 954463 | 4/1964 | United Kingdom . |
| 1555276 | 11/1979 | United Kingdom . |
| 1604403 | 12/1981 | United Kingdom . |

*Primary Examiner*—James Engel
*Attorney, Agent, or Firm*—Ostrolenk, Faber, Gerb & Soffen

[57] ABSTRACT

A ceramic laminate obtained by stacking a plurality of ceramic green sheets is charged in a die comprising a base, a frame and an upper punch, which are formed of rigid bodies respectively, and brought into a sealed state. When hydrostatic pressure is applied in this state, the upper punch is pressurized to approach the base, thereby uniformly compression-compacting the ceramic laminate.

5 Claims, 5 Drawing Sheets

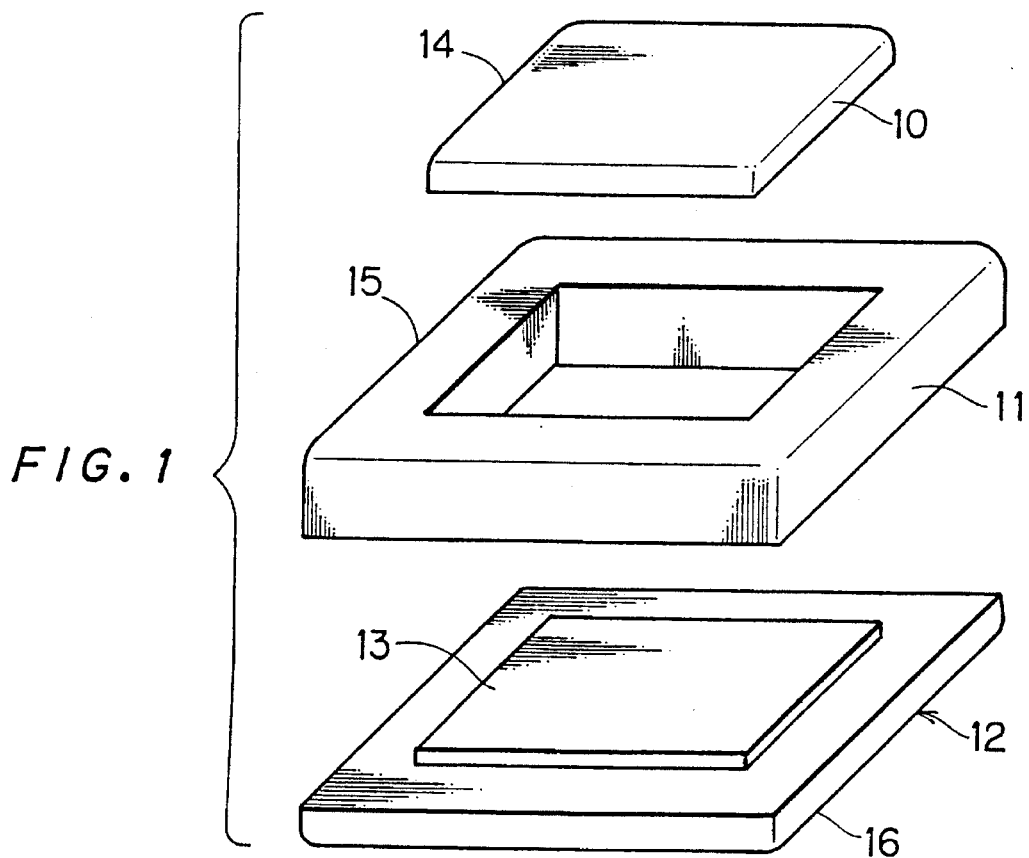
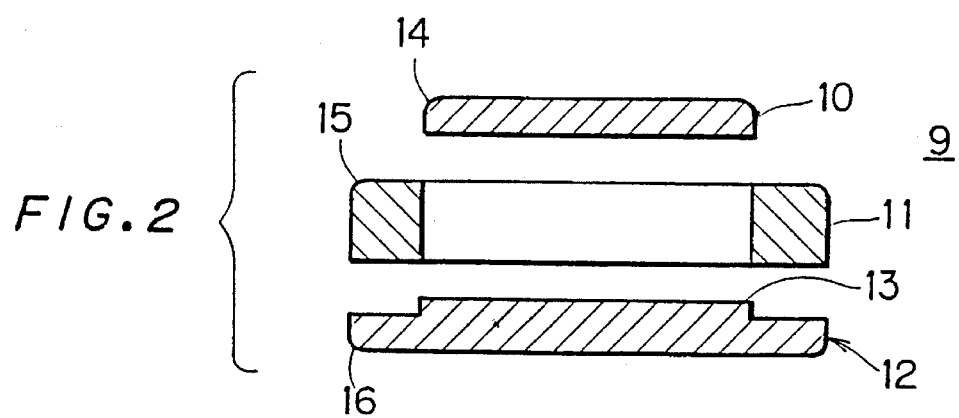

1

METHOD OF MANUFACTURING CERAMIC LAMINATED COMPACT

This is a continuation of application Ser. No. 07/451,227 filed on Dec. 15, 1989, now abandoned.

BACKGROUND OF THE INVENTION

1. Field of the Invention

The present invention relates to a method of obtaining a ceramic laminated compact by compression-compacting a ceramic laminate which is formed by stacking a plurality of ceramic green sheets.

The present invention is directed to a ceramic laminated compact which is to be obtained during a process for manufacturing an electric or electronic component such as a capacitor, an inductor, a multilayer substrate or the like, for example. In order to obtain a large number of such components, the ceramic laminated compact is cut into independent components, which are then subjected to a firing step. Alternatively, the ceramic laminated compact is directly subjected to a firing step in order to obtain a single component.

2. Description of the Background Art

Hydrostatic pressing, which can uniformly apply pressure for compression compacting, is watched as effective means for obtaining the aforementioned type of ceramic laminated compact.

For example, Japanese Patent Laying-Open Nos. 9718/1986 and 159719/1986 disclose methods of obtaining ceramic laminated compacts through hydrostatic pressing. According to the former literature, a ceramic laminate is held between two flexible sheets, whose peripheral edge portions are sealed to vacuum-package the ceramic laminate. Then, the vacuum-packaged ceramic laminate is subjected to hydrostatic pressing. According to the latter literature, on the other hand, a frame is provided around a ceramic laminate, which is held between two flexible sheets. A space defined by the two flexible sheets and the frame is evacuated, and then the ceramic laminate covered with the flexible sheets is subjected to hydrostatic pressing.

In each case, however, both surfaces of the ceramic laminate are merely covered with the flexible sheets, and hence a flat state of the ceramic laminate is easily damaged by partial bending or the like.

In order to solve such a problem, there has been proposed a method of arranging a rigid body along one major surface of a ceramic laminate. This method is basically disclosed in Japanese Patent Laying-Open No. 292309/1986.

FIG. 11 shows this method. As shown in FIG. 11, a ceramic laminate 3 obtained by stacking a plurality of ceramic green sheets is introduced into a cavity 1 which is provided in a die 2. Then, as shown in FIG. 12, the ceramic laminate 3 and the die 2 are introduced into a bag 4, which is made of a flexible sheet material, to be protected against water. Thereafter the bag 4 is evacuated and its opening is sealed by thermal welding, for example, at a portion 5. The bag 4 containing the ceramic laminate 3 and the die 2 is submerged in water, and then pressure is applied to the water. Thus, the ceramic laminate 3 is subjected to compression compacting on the basis of hydrostatic pressure, thereby to obtain a ceramic laminated compact.

However, the hydrostatic pressing in the aforementioned mode has the following problem:

Noting modes of force acting on major surfaces of the ceramic laminate 3, one major surface (lower surface) of the ceramic laminate 3 is in contact with the bottom surface of the cavity 1 provided in the die 2, which serves as a rigid body, while hydraulic pressure is directly applied to the other major surface (upper surface) through the bag 4. This results in the configuration of a ceramic laminated compact 6 shown in FIG. 13, for example.

Referring to FIG. 13, the ceramic laminated compact 6 to be worked into electrical or electronic components is provided therein with internal electrodes 7, which are formed by printing or the like. Thus, projections 8 are formed on the upper surface of the compact 6 in portions provided with the internal electrodes 7, although the compact 6 has a flat lower surface. Such projections 8 extremely protrude as the number of stacking of the internal electrodes 7 is increased.

When the aforementioned compact 6, which is provided with the projections 8 on only one surface, is adapted to manufacture chip components, for example, appearances of such chip components are vertically asymmetrized due to projections, corresponding to the projections 8, which are provided only in first surfaces. Such vertically asymmetrical chip components are unpreferable in appearance, while imperfect contact may be caused between the electrodes of the chip components and conductive parts provided on substrates when the chip components are mounted on the substrates.

SUMMARY OF THE INVENTION

Accordingly, an object of the present invention is to provide a method of manufacturing a ceramic laminated compact, which can prevent the compact from a vertically asymmetrical configuration while basically employing hydrostatic pressing.

The inventive method of manufacturing a ceramic laminated compact is characterized in that a holder is employed for compression-compacting a ceramic laminate obtained by stacking a plurality of ceramic green sheets to compress the ceramic laminate through first and second members which are in contact with respective major surfaces of the ceramic laminate while substantially identically behaving in hydrostatic pressure as well as to hold the ceramic laminate in a state sealed against the exterior.

According to the present invention, hydrostatic pressure is applied to a ceramic laminate, respective major surfaces of which are compressed by first and second members substantially identically behaving in the hydrostatic pressure. Therefore, the major surfaces of the ceramic laminate are pressurized under equal conditions.

Thus, a ceramic laminated compact obtained according to the present invention is vertically symmetrized in substance. When the respective major surfaces of the ceramic laminate are in contact with first and second members which are formed of rigid bodies respectively, major surfaces of the obtained ceramic laminated compact are flattened. If the first and second members are formed of an elastic or flexible material such as rubber, on the other hand, projections are symmetrically defined on both major surfaces in portions provided with internal electrodes, for example, so that the obtained ceramic laminated compact is ultimately vertically symmetrized in substance.

Therefore, a chip component which is formed by the ceramic laminated compact according to the present invention has a vertically symmetrical appearance, and even if the component has projections, protrusion thereof can be reduced to about half as compared with the prior art shown in FIG. 13. Thus, such a chip component hardly causes imperfect contact with a substrate when the former is mounted on the latter.

The advantage of hydrostatic pressing remains intact as a matter of course. That is, pressure can be uniformly applied to the ceramic laminate in the same direction regardless of the size and dimensions of the laminate. Thus, it is possible to obtain a laminated compact, which is uniformly compression-compacted with no regard to its size and configuration. Further, sufficient pressure can be easily applied to the ceramic laminate, whereby no air is left in the obtained ceramic laminated compact to cause separation of sheets or the like. Thus, a ceramic component of high quality can be obtained.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is an exploded perspective view showing an upper punch 10, a frame 11 and a base 12 which are included in a die 9 forming a part of a holder 18 employed in an embodiment of the present invention;

FIG. 2 is an exploded sectional view illustrating the upper punch 10, the frame 11 and the base 12 shown in FIG. 1.

DESCRIPTION OF THE PREFERRED EMBODIMENTS

FIGS. 1 to 7 are diagrams for illustrating an embodiment of the present invention.

Figure 11:
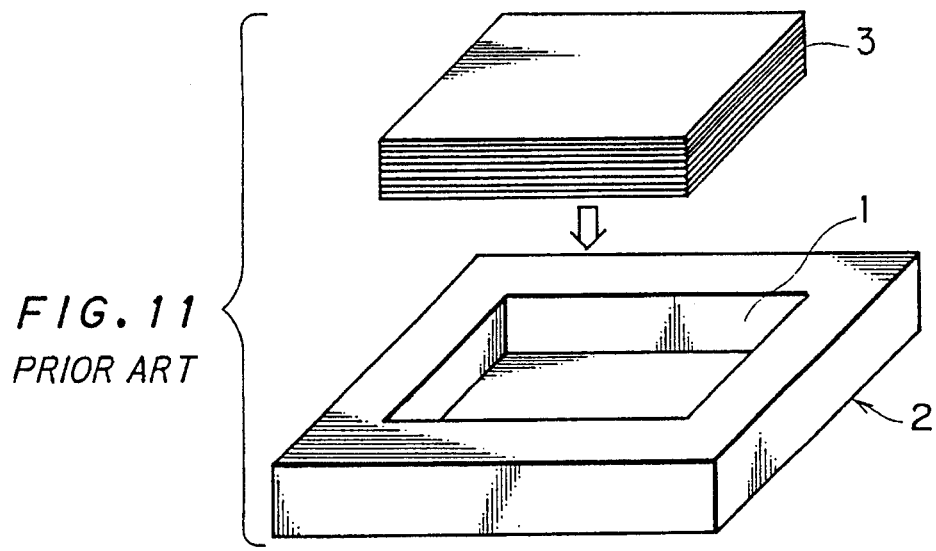
FIG. 11 is an exploded perspective view showing a die 2 employed in a conventional hydrostatic pressing step and a ceramic laminate 3.

First, a ceramic laminate 3, such as that shown in FIG. 11, is prepared. This ceramic laminate 3 is obtained by printing internal electrodes on ceramic green sheets which are manufactured at desire by a reverse roll coater or doctor blade coater, for example, and stacking the ceramic green sheets.

On the other hand, a die 9 is prepared as shown in FIGS. 1 and 2. The die 9 comprises an upper punch 10, a frame 11 and a base 12, which are formed of rigid bodies respectively. A step portion 13 is formed on the upper surface of the base 12, in order to achieve location between the same and the frame 11. The upper punch 10 is so sized as to engage with the inner periphery of the frame 11. Corners 14, 15 and 16 of the upper punch 10, the frame 11 and the base 12 are preferably rounded so that the bag 4, containing the die 9 as shown in FIG. 12, is not broken when the same is pressed against the outer surface of the die 9 by application of hydraulic pressure.

Figure 3:
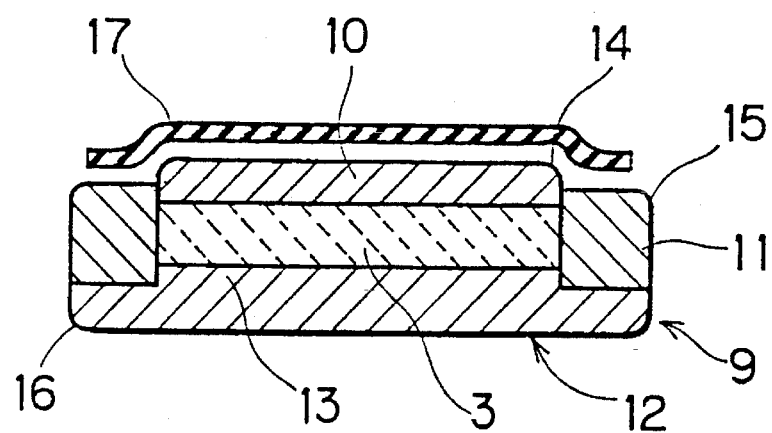
FIG. 3 is a sectional view illustrating a ceramic laminate 3 which is charged in the die 9 shown in FIGS. 1 and 2 and covered with a protective rubber member 17.

Referring to FIG. 3, the ceramic laminate 3 shown in FIG. 11 is introduced into a cavity defined by the base 12 and the frame 11, which are combined with each other. The outer periphery of the ceramic laminate 3 is substantially equal in size and configuration to the inner periphery of the frame 11. In general, films of polyethylene terephthalate, polypropylene or the like are laid on upper and lower major surfaces of the ceramic laminate 3, so that a ceramic laminated compact obtained by compressing the ceramic laminate 3 is easily separated from the upper punch 10 and the base 2. In place of such films, prescribed surfaces of the upper punch 10, the base 12 and the frame 11 may be previously treated with a release agent. The upper punch 10 is located above the ceramic laminate 3, so that at least its lower portion is received in the frame 11.

A protective rubber member 17 may be further laid on the upper punch 10, to prevent the bag 4 (FIG. 12) from entering a clearance between the upper punch 10 and the frame 11 by hydraulic pressure, thereby protecting the bag 4 against breakage.

Figure 12:
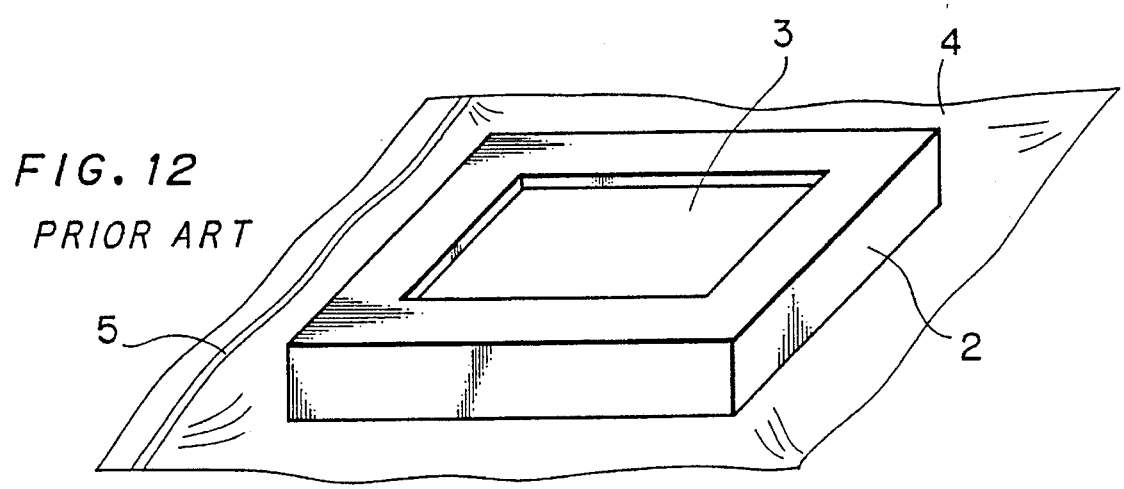
FIG. 12 is a perspective view illustrating the ceramic laminate 3 which is introduced into the die 2 shown in FIG. 11 and vacuum-packaged within a bag 4.

The ceramic laminate 3, which is in the state of FIG. 3, is introduced into the bag 4 shown in FIG. 12. This bag 4 is formed of a laminate sheet, for example. Air is discharged from the bag 4 and the sealed portion 5 is formed by thermal welding, for example, to attain a vacuum-packaged state so that the degree of vacuum within the bag is 1 to 2 Torr.

The ceramic laminate 3 is introduced into the die 9 and then vacuum-packaged in the bag 4 as hereinabove described, whereby a holder 18 (see FIG. 4) comprising the die 9 and the bag 4 is defined to hold the ceramic laminate 3 in a state sealed against the exterior.

Figure 4:
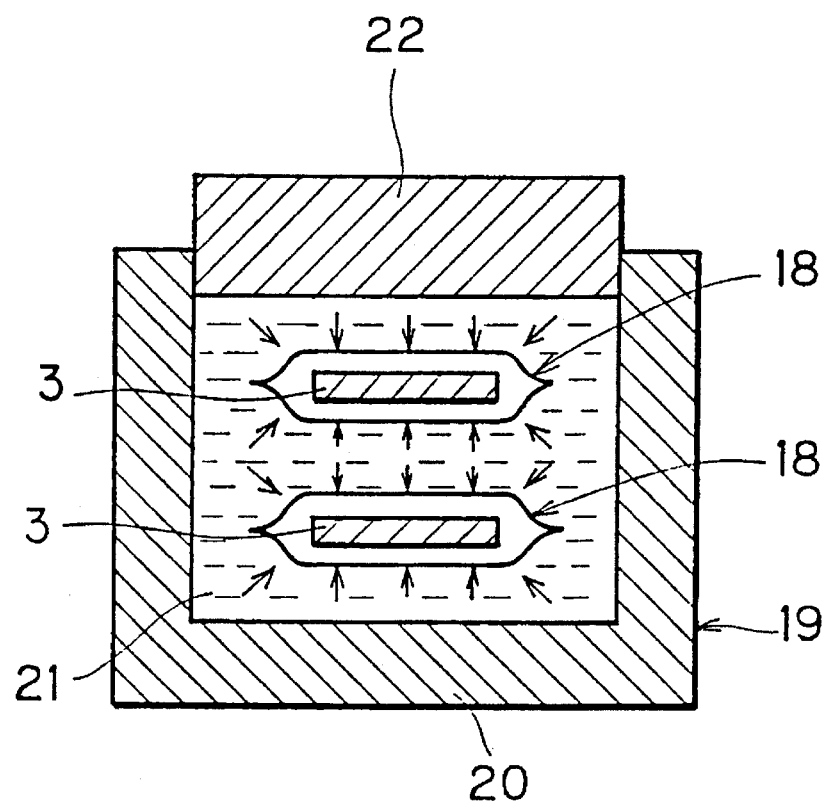
FIG. 4 is a sectional view illustrating a hydrostatic presser 19 which is in a state of applying hydrostatic pressure to the structure shown in FIG. 3.

The holder 18 thus charged with the ceramic laminate 3 is dipped in water 21 contained in a water tank 20 which is provided in a hydrostatic presser 19, as shown in FIG. 4. Thereafter the water tank 20 is closed by a cover 22. Then, pressure is applied to the water 21 contained in the water tank 20, so as to pressurize the ceramic laminate 3 through the upper punch 10 and the base 12 which are included in the holder 18. The water 21 is preferably heated to about 70° C., for example, in order to improve fluidity of a binder contained in the ceramic laminate 3, thereby increasing junction strength between the sheets. In the step of applying such hydrostatic pressure, the upper punch 10 (first member) and the base 12 (second member), which are in contact with the major surfaces of the ceramic laminate 3, substantially identically behave in the hydrostatic pressure since both of the same are formed of rigid bodies.

After the step of applying hydrostatic pressure is completed, the holder 18 is drawn out from the hydrostatic presser 19. Then the bag 4 is broken to extract the die 9. After the die 9 is thus extracted, the upper punch 10 is separated from the frame 11 through a magnet or the like, and then the base 12 is separated from the frame 11. The upper punch 10 and the base 12 can be easily separated from the frame 11 through the action of the aforementioned films or release agent.

Figure 5:
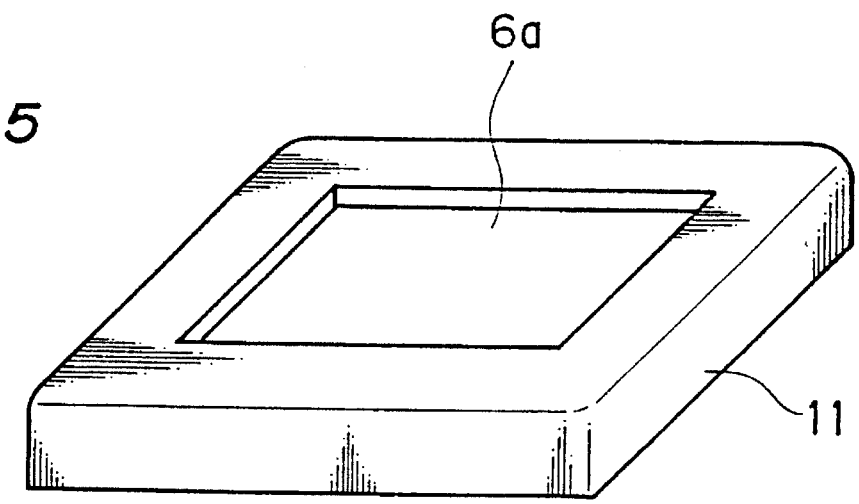
FIG. 5 is a perspective view showing the frame 11 holding a ceramic laminated compact 6a which is obtained after the hydrostatic pressure applying step.
Figure 6:
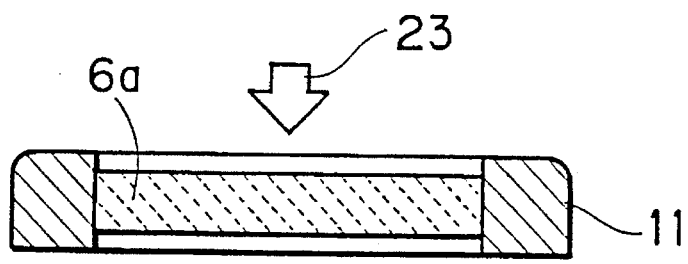
FIG. 6 is a sectional view illustrating the state shown in FIG. 5.

FIGS. 5 and 6 illustrate the frame 11, from which the upper punch 10 and the base 12 are separated. A ceramic laminated compact 6a is obtained by compression-compacting the ceramic laminate 3 which is in close contact with the inner peripheral surface of the frame 11. This compact 6a is pressed from its one major surface side as shown by an arrow 23, and extracted from the frame 11.

Figure 7:
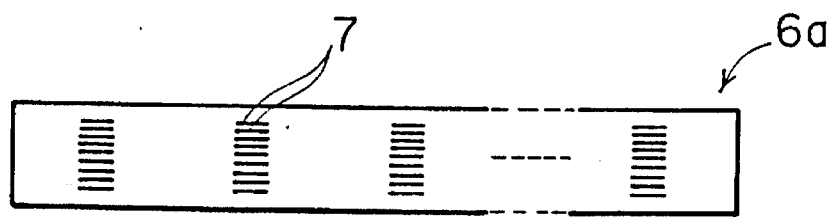
FIG. 7 is a sectional view independently showing the ceramic laminated compact 6a shown in FIGS. 5 and 6.

FIG. 7 shows the compact 6a thus obtained. As understood from FIG. 7, both major surfaces of the compact 6a are flat regardless of internal electrodes 7. In other words, the compact 6a is vertically symmetrized.

Another example of the die which is included in the holder will be described.

Figure 8:
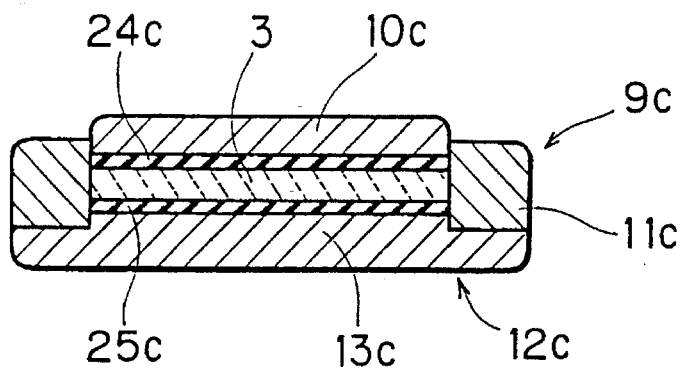
FIG. 8 is a sectional view showing a die 9c forming a part of a holder employed in another embodiment of the present invention and a ceramic laminate 3 charged therein.

Referring to FIG. 8, a die 9c comprises an upper punch 10c, a frame 11c and a base 12c which has a step portion 13c engaging with the frame 11c, as well as an upper rubber member 24c and a lower rubber member 25c. The lower rubber member 25c is laid on the bottom of a cavity defined by the frame 11c and the base 12c to introduce a ceramic laminate 3 into the frame 11c, which in turn is covered with the upper rubber member 24a and the upper punch 10c in this order. In this state, the die 9c is introduced into the bag 4 shown in FIG. 12, and subjected to processing similar to that in the aforementioned embodiment.

Figure 9:
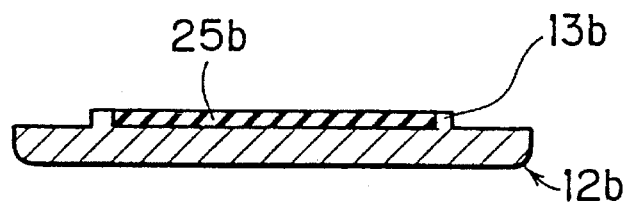
FIG. 9 is a sectional view illustrating a base 12b and a lower rubber member 25b which are employed in place of a base 12c and a lower rubber member 25c shown in FIG. 8.

FIG. 9 illustrates a base 12b, which is employed in place of the base 12c and the lower rubber member 25c shown in FIG. 8. The base 12b has a step portion 13b, in which a lower rubber member 25b is previously embedded.

In the embodiments shown in FIGS. 8 and 9, the upper rubber member 24c (first member) and the lower rubber member 25c or 25b (second member) which are in contact with the both major surfaces of the ceramic laminate 3 are made of elastic materials, to substantially equally behave in hydrostatic pressure.

Figure 10:
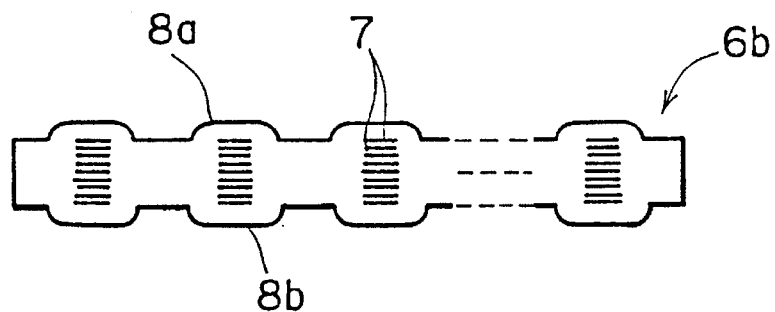
FIG. 10 is a sectional view illustrating a ceramic laminated compact 6b which is obtained in the embodiment shown in FIG. 8 or 9.
Figure 13:
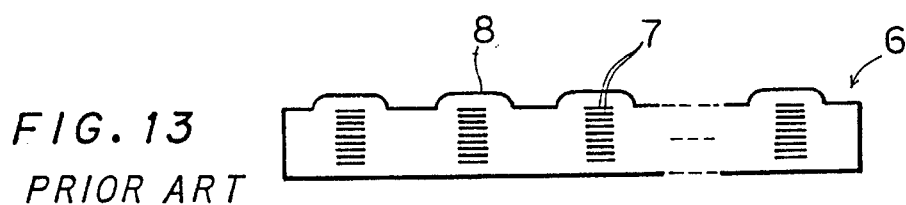
FIG. 13 is a sectional view illustrating a ceramic laminated compact 6 which is obtained by performing hydrostatic pressing in the state shown in FIG. 12.

FIG. 10 shows a ceramic laminated compact 6b, which is obtained in the embodiment shown in FIG. 8 or 9. The compact 6b is provided with projections 8a and 8b in portions which are formed with internal electrodes 7. The projections 8a and 8b symmetrically protrude from both major surfaces of the compact 6b, which is ultimately retained in a vertically symmetrical configuration in substance. The projections 8a and 8b on the compact 6b are formed for the same reasons that the projections 8 are formed in one surface of the compact 6 of FIG. 13. More specifically, without rigid surfaces engaging the major surfaces of the ceramic laminate 3, the thickness of the ceramic laminate becomes smaller in the portions without electrodes than in the portions having electrodes, the difference in thickness between these portions corresponding to the total thickness of the electrodes.

The first and second members, which are in contact with the both major surfaces of the ceramic laminate, may be formed of different materials so far as the same substantially identically behave in hydrostatic pressure.

Although the present invention has been described and illustrated in detail, it is clearly understood that the same is by way of illustration and example only and is not to be taken by way of limitation, the scope of the present invention being limited only by the terms of the appended claims.

What is claimed is:

1. A method of manufacturing a ceramic laminated compact, comprising the steps of:

obtaining a ceramic laminate by stacking a plurality of ceramic green sheets, at least one of said ceramic green sheets being an internal sheet having electrodes thereon;

preparing a die for compressing said ceramic laminate through first and second members being in contact with respective major surfaces of said ceramic laminate and substantially identically behaving in hydrostatic pressure, said first member comprising an upper rigid punch, said second member comprising a lower rigid base and said die further comprising a rigid frame having an inner periphery defining an opening for the ceramic laminate, the inner periphery having substantially the same configuration and size as the outer periphery of the ceramic laminate, the punch being slidable into and out of the frame opening and the base having a step portion received within the frame opening in engagement with the inner periphery of the frame and the base together with the opening of the frame defining a cavity for fully receiving the ceramic laminate therein;

placing said ceramic laminate in a state sealed against the exterior;

charging said ceramic laminate in said die; and applying hydrostatic pressure to said ceramic laminate being charged in said die for compression-compacting said ceramic laminate, thereby obtaining a ceramic laminated compact without any deformation of the electrodes thereof.

2. A method in accordance with claim 1, wherein said first and second members include respective elastic sheets interposed between the respective rigid surfaces of said first and second members and said respective major surfaces of said ceramic laminate.

3. A method in accordance with claim 1, wherein said upper punch, said frame and said base have outwardly directed rounded corners.

4. A method in accordance with claim 1, wherein said step of applying hydrostatic pressure includes a step of heating said ceramic laminate.

5. A method in accordance with claim 1, wherein the step of placing said ceramic laminate in a state sealed against the interior includes introducing said ceramic laminate into a bag made of a flexible sheet material impervious to water, evacuating the interior of said bag and sealing the bag.

* * * * *